(12) United States Patent
Higuchi et al.

(10) Patent No.: US 9,040,413 B2
(45) Date of Patent: May 26, 2015

(54) USING SATURATED AND UNSATURATED ALD PROCESSES TO DEPOSIT OXIDES AS RERAM SWITCHING LAYER

(71) Applicants: Intermolecular Inc., San Jose, CA (US); Kabushiki Kaisha Toshiba, Tokyo (JP); SanDisk 3D LLC, Milpitas, CA (US)

(72) Inventors: Randall J. Higuchi, San Jose, CA (US); Chien-Lan Hsueh, Campbell, CA (US); Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 183 days.

(21) Appl. No.: 13/714,162

(22) Filed: Dec. 13, 2012

(65) Prior Publication Data

US 2014/0166956 A1  Jun. 19, 2014

(51) Int. Cl.
*H01L 21/44* (2006.01)
*H01L 45/00* (2006.01)
*H01L 27/24* (2006.01)

(52) U.S. Cl.
CPC ............ *H01L 45/1608* (2013.01); *H01L 45/08* (2013.01); *H01L 45/10* (2013.01); *H01L 45/1233* (2013.01); *H01L 45/145* (2013.01); *H01L 45/146* (2013.01); *H01L 45/1616* (2013.01); *H01L 27/2409* (2013.01); *H01L 27/2463* (2013.01)

(58) Field of Classification Search
CPC ................. H01L 21/28556; H01L 21/76843
USPC .......... 438/584, 635, 648, 680, 683; 439/635, 439/648, 680, 684
See application file for complete search history.

(56) References Cited

U.S. PATENT DOCUMENTS

| | | | |
|---|---|---|---|
| 7,084,078 B2 | 8/2006 | Ahn et al. | |
| 7,122,415 B2 | 10/2006 | Jang et al. | |
| 7,508,648 B2 | 3/2009 | Ahn et al. | |
| RE43,025 E * | 12/2011 | Basceri et al. | 428/469 |
| 2007/0232501 A1* | 10/2007 | Tonomura | 505/473 |
| 2008/0044569 A1 | 2/2008 | Myo | |

(Continued)

OTHER PUBLICATIONS

Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

(Continued)

*Primary Examiner* — Lex Malsawma
*Assistant Examiner* — Eric Jones

(57) ABSTRACT

A nonvolatile memory device contains a resistive switching memory element with improved device switching performance and lifetime by custom tailoring the average concentration of defects in the resistive switching film and methods of forming the same. The nonvolatile memory element includes a first electrode layer, a second electrode layer, and a resistive switching layer disposed between the first electrode layer and the second electrode layer. The resistive switching layer comprises a first sub-layer and a second sub-layer, wherein the first sub-layer has more defects than the first sub-layer. A method includes forming a first sub-layer on the first electrode layer by a first ALD process and forming a second sub-layer on the first sub-layer by a second ALD process, where the first sub-layer has a different amount of defects than the second sub-layer.

8 Claims, 10 Drawing Sheets

(56) References Cited

U.S. PATENT DOCUMENTS

| | | | |
|---|---|---|---|
| 2008/0157279 A1* | 7/2008 | Horikawa | 257/534 |
| 2010/0065803 A1* | 3/2010 | Choi et al. | 257/4 |
| 2010/0227476 A1 | 9/2010 | Peck | |
| 2010/0243983 A1* | 9/2010 | Chiang et al. | 257/4 |
| 2011/0008955 A1* | 1/2011 | Horii et al. | 438/608 |

OTHER PUBLICATIONS

Kim, S., et al.; High dielectric constant TiO2 thin films on a Ru electrode grown at 250 C by AtomicLayer Deposition; Nov. 1, 2004; Seoul National University Industry Foundation; Applied Physics Letters V.85 N. 18 1112004.

Kim, Y.M., et al.; Characteristics of Atomic Layer Deposition Grown HfO2 Films After Exposure to Plasma Treatments; Jan. 1, 2007; Kookje Electric Korea Co. Ltd; Thin Solid Films pp. 2984-2989.

Goldstein, D., et al.; Al2O3 Atomic Layer Deposition with Trimethylauminum and Ozone Studied by in Situ Transmission FTIR Spectroscopy and Quadrupole Mass Spectrometry; Jan. 1, 2008; The Regents of the University of Colorado; J. Phys. Chem pp. 19530-19539.

Bartholomew, L., et al.; Advanced Process Control of HfxSilxO2 Composition Using Colnjection Atomic Layer Deposition; Jan. 1, 2009; The Electrochemical Society; ECS Transactions pp. 567-574.

Kamiyama, S., et al.; Improving Threshold Voltage and Device Performance of GateFirst HfSiONMetal Gate nMOSFETs by an ALD La2O3 Capping Layer; Jan. 1, 2008; The Electrochemical Society; Journal of the Electrochemical Society pp. H373-H377.

Yanguas-Gil, A., et al.; Controlled Dopant Distribution and Higher Doping Efficiencies by SurfaceFunctionalized Atomic Layer Deposition; Jan. 1, 2011; Z—Book—American Chemical Society; Chemistry of Materials 3 pages.

Yun, et al.; Dependence of atomic layerdeposited Al2O3 films characteristics on growth temperature and Al precursors of AICH33 and AICl3; Jul. 25, 1997; Vacuum Society; Semiconductor Technology Division Electronics and Telecommunications Research Institute.

Groner, M.D., et al.; Electrical characterization of thin Al2O3 films grown by atomic layer deposition on silicon and various metal substrates; Apr. 19, 2002; Z—Book—Elsevier; Thin Solid Films 413 186197.

Kim, K. S. et al.; Low Temperature 100C Deposition of Aluminum Oxide Thin Films by ALD with O3 as Oxidant; Jan. 1, 2006; The Electrochemical Society; Journal of the Electrochemical Society 153 5 F69F76.

* cited by examiner

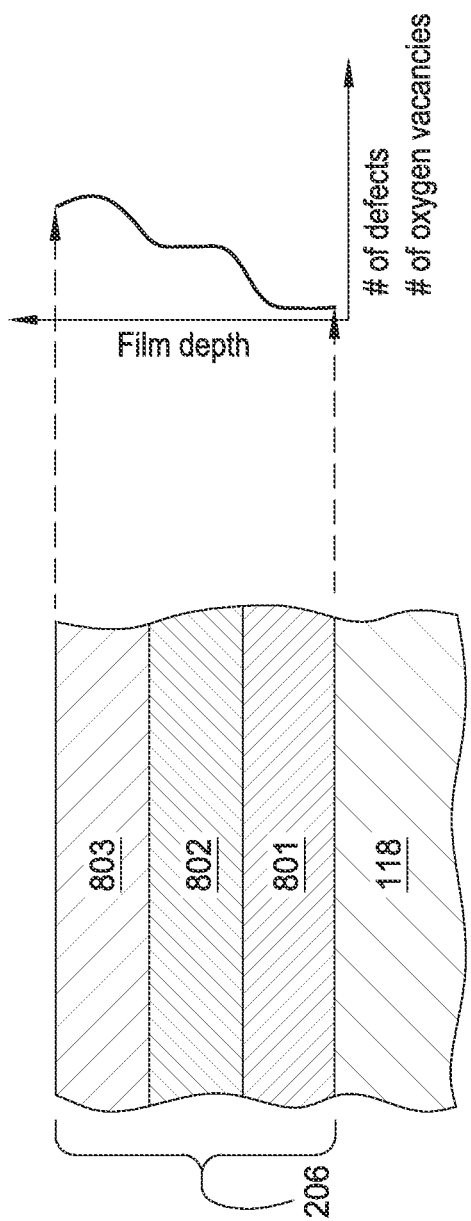

USING SATURATED AND UNSATURATED ALD PROCESSES TO DEPOSIT OXIDES AS RERAM SWITCHING LAYER

BACKGROUND OF THE INVENTION

1. Field of the Invention

This invention relates to nonvolatile memory elements, and more particularly, to methods for forming resistive switching memory elements used in nonvolatile memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Conventional films used to form resistive switching layers in resistive switching nonvolatile memory have defects, e.g. traps or oxygen vacancies, within the films and exhibit different resistance states. However, because the amount and distribution of defects within the film may be random, the amount of power needed to switch the resistance states of such films may be high. Additionally, conventional resistive switching layers may be formed of a hard oxide material in order to reduce the leakage current in the resistive switching layer but which also make it more difficult to switch resistive states. Alternatively, they may be formed of a high leakage current material which results in high power consumption because of difficulty to reset to a resistive state.

Moreover, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably set and reset "on" and "off" states of the device to minimize overall power consumption of the memory chip as well as resistive heating of the device and cross-talk between adjacent devices.

Moreover, as nonvolatile memory device sizes shrink it becomes increasing necessary to assure that the "set" and "reset" currents used to change the state of the memory element are not too large so as to require higher voltage transistors for chip control circuitry, as well as to minimize damage to or alter the electrical or physical properties of the one or more layers found in the formed memory device. A large current flowing through the current carrying lines in a memory array can also undesirably alter or disturb the memory state of other interconnected devices or possibly damage portions of the adjacently connected devices, due to an appreciable amount of "cross-talk" created between them.

There is a need to limit and/or minimize the required current used to program the logic states of each of the interconnected devices in an effort to reduce chip overall power consumption as well as improve device longevity and reduce the possibility of cross-talk between adjacently connected devices, which can alter a nonvolatile memory's device state. It is also desirable to form a nonvolatile memory device that has low programming currents when switching the device between the "on" and "off" states. Therefore, it is desirable to form a nonvolatile memory device that requires low programming currents to change the device between the "on" and "off" states.

SUMMARY OF THE INVENTION

Embodiments according to the invention generally relate to a resistive switching nonvolatile memory device having a resistive switching layer and methods of forming the resistive switching layer. In some embodiments, the method of forming a resistive switching layer over a first electrode layer includes forming a first sub-layer on the first electrode layer by a first ALD process and forming a second sub-layer on the first sub-layer by a second ALD process, the first sub-layer having a different amount of defects than the second sub-layer.

In some embodiments, a method of forming a nonvolatile memory element in a ReRAM device includes forming a resistive switching layer over a first electrode layer. The resistive switching layer includes a first sub-layer deposited by a first ALD process and a second sub-layer deposited by a second ALD process, the second sub-layer having more defects than the first sub-layer. The method also includes forming a second electrode layer, so that the resistive switching layer is disposed between the first electrode layer and the second electrode layer.

In some embodiments, a nonvolatile memory element includes a first electrode layer, a second electrode layer, and a resistive switching layer disposed between the first electrode layer and the second electrode layer. The resistive switching layer includes a first sub-layer and a second sub-layer, wherein the first sub-layer has more defects than the first sub-layer.

BRIEF DESCRIPTION OF THE DRAWINGS

So that the manner in which the above recited features according to the present invention can be understood in detail, a more particular description, may be had by reference to embodiments, some of which are illustrated in the appended drawings. It is to be noted, however, that the appended drawings illustrate only typical embodiments and are therefore not to be considered limiting of its scope, and may admit to other equally effective embodiments.

FIG. 6A schematically illustrates a cross-sectional view of a resistive switching layer formed.

FIG. 6B is a graph illustrating the average concentration of defects and/or oxygen vacancies versus film depth of the resistive switching layer.

FIG. 8A schematically illustrates a cross-sectional view of a resistive switching layer formed.

FIG. 8B is a graph illustrating the average concentration of defects and/or oxygen vacancies versus film depth of the resistive switching layer formed.

While the foregoing is directed to embodiments of the present invention, other and further embodiments may be devised without departing from the basic scope thereof, and the scope thereof is determined by the claims that follow.

DETAILED DESCRIPTION

Embodiments generally described herein include a method of forming a nonvolatile memory device that contains a resistive switching memory element that has an improved device switching performance and increased usable lifetime due to tailoring the average concentration of defects and/or oxygen vacancies in the resistive switching layer. Thus, embodiments described provide the ability to custom tailor a average defect concentration gradient in the resistive switching layer. In order to simplify discussion, the term "defects" will be used throughout to also refer to "traps" or "oxygen vacancies". Additionally, it is noted that relative directional terms used herein with regard to embodiments described are for purposes of description only, and do not limit the scope. Specifically, directional terms such as "over," "above," "under," and the like are used under the assumption that substrate 201 on which embodiments are formed is a "bottom" element and is therefore "under" elements formed thereon.

In some embodiments, the resistive switching layer comprises a first sub-layer deposited by a first ALD process and a second sub-layer deposited by a second ALD process. The first sub-layer has a different average concentration of defects than the second sub-layer. In some embodiments, the first sub-layer may have more defects than the second sub-layer. Alternatively, the second sub-layer may have more defects than the first sub-layer. In some embodiments, the resistive switching layer includes a third sub-layer formed over the second sub-layer by a third ALD process. The second sub-layer has a different average concentration of defects than the third sub-layer. In some embodiments, the third sub-layer may have more defects than the second sub-layer. Alternatively, the second sub-layer may have more defects than the third sub-layer. The electrical properties of the formed resistive switching layer are configured to lower the power required to change the resistive switching layer from a low resistance state (LRS) to a high resistance state (HRS) and vice-versa. It is generally desirable to form the resistive switching layer so that its material and electrical properties will not degrade or breakdown during the often high current "burn-in" type device preparation steps, such as the "electrical forming" process, and also during normal repetitive operation of the nonvolatile resistive switching memory device.

Figure 1:
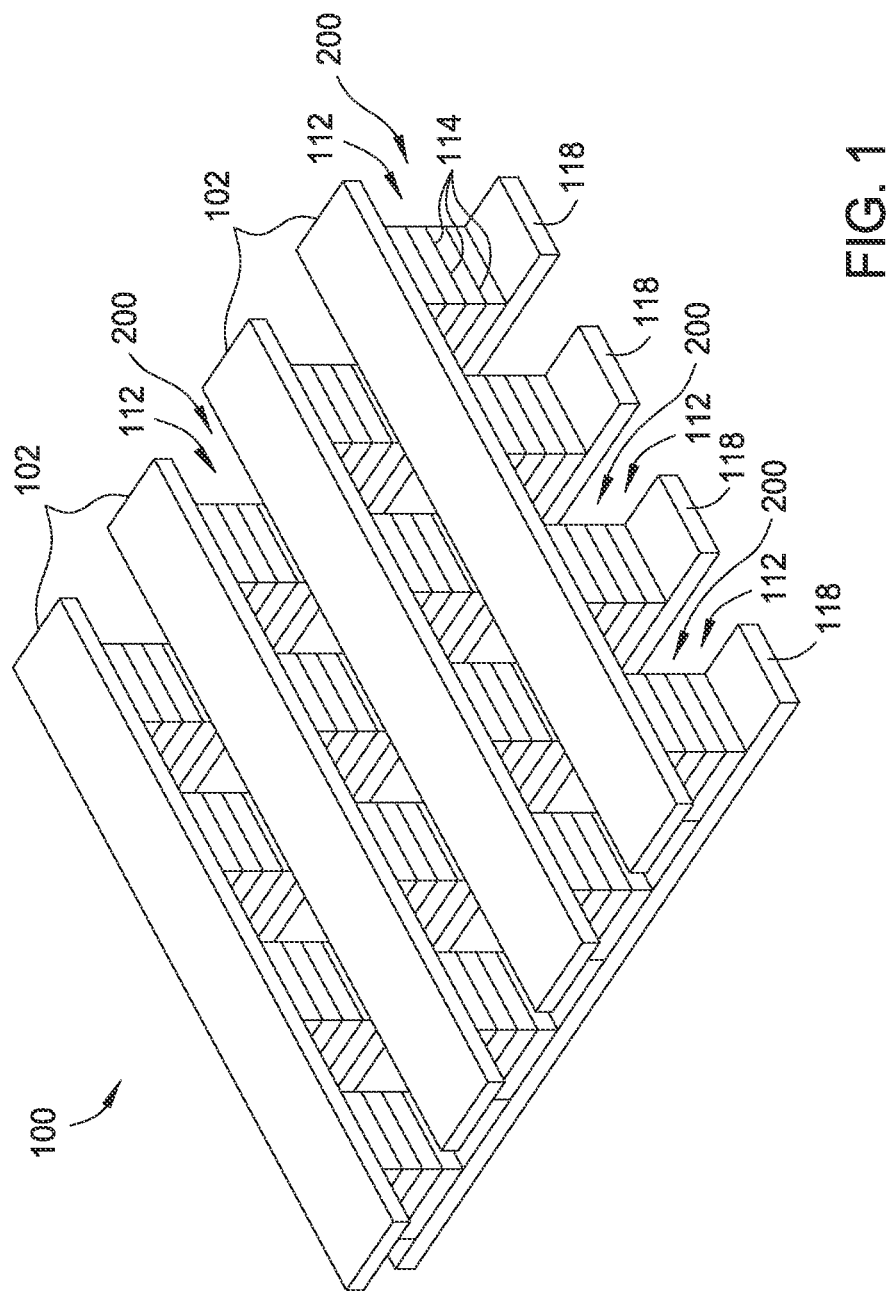
FIG. 1 is a perspective view of a memory array of memory devices, configured according to some embodiments.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and bit-lines, which are referred to herein generally as electrodes 102 and 118, and are used to read from or write data into the memory element 200. Electrodes 102 and 118 generally include one or more conductive layers, each conductive layer having a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the embodiments described herein.

Figure 2A:
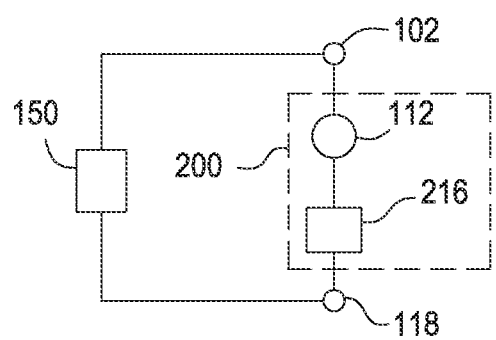
FIG. 2A is a schematic cross-sectional view of a memory device, configured in accordance with an embodiment.

FIG. 2A schematically illustrates one example of some embodiments of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In some embodiments, the current steering device 216 may include two or more layers of semiconductor material, such as two or more doped silicon layers, that are configured to allow or inhibit the current flow in different directions through the memory element 112 when that memory element is not selected to read.

Figure 2B:
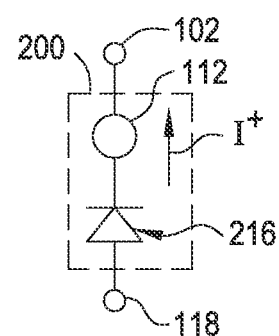
FIG. 2B schematically illustrates a memory device configured to allow current to flow through the memory device in a forward direction.

FIG. 2B schematically illustrates a switching memory device 200 that contains a memory element 112 and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

During operation, such as a read operation, the state of a memory element 112 in the switching memory device 200 can be sensed by applying a sensing voltage (i.e., a "read" voltage $V_{READ}$ (FIG. 3)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118. In some embodiments, the memory element 112 uses bipolar switching where opposite polarity set and reset voltages are used to alter the resistance of the memory element between high and low resistance states.

Figure 3:
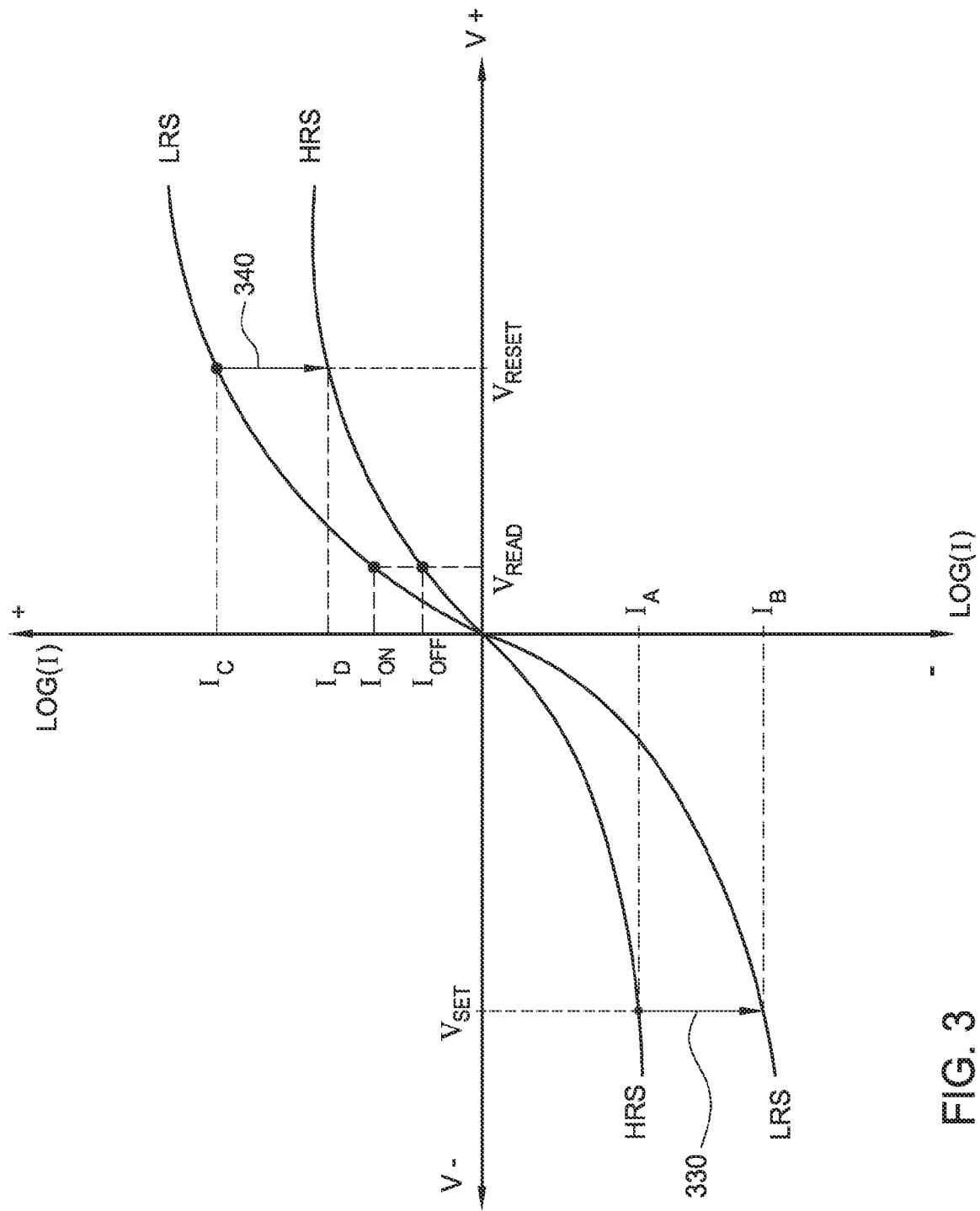
FIG. 3 schematically illustrates exemplary log-log plots of measured current (I) values versus applied voltages (V) of an exemplary embodiment of a memory device having a resistive switching memory element.

FIG. 3 schematically illustrates a log-log plot of current (I) versus voltage (V) of one example of the low-resistance-state (LRS) and high-resistant-state (HRS) curves of a memory element 112 having these two bistable resistive states. The voltage levels $V_{SET}$ and $V_{RESET}$, shown in FIG. 3, illustrate typical threshold values used to "set" and "reset" the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −1 V to −4 V) across electrodes 102 and 118. In one configuration, applying a negative $V_{SET}$ voltage to memory element 112 causes memory element 112 to switch to its low resistance state. In some embodiments in which a novel resistive switching layer comprises a metal nitride or metal oxide-nitride, it is believed that the defects or traps that provide multiple resistance capability for the resistive switching layer may be nitrogen or oxygen vacancies. It is believed that the change in the resistive state of memory element 112 may be due to the redistribution or filling of traps (i.e., "trap-mediated") or defects in the resistive switching layer 206 (FIG. 4, 6A, or 8A) of memory element 112 when the memory device 200 is reverse biased. The defects or traps, which are commonly thought to be oxygen vacancies, may be formed during the deposition and/or post-processing of the resistive switching layer 206. In some embodiments, the defects may be created by a non-stoichiometric material composition found in the formed resistive switching layer 206.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +1 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity.

Figure 4:
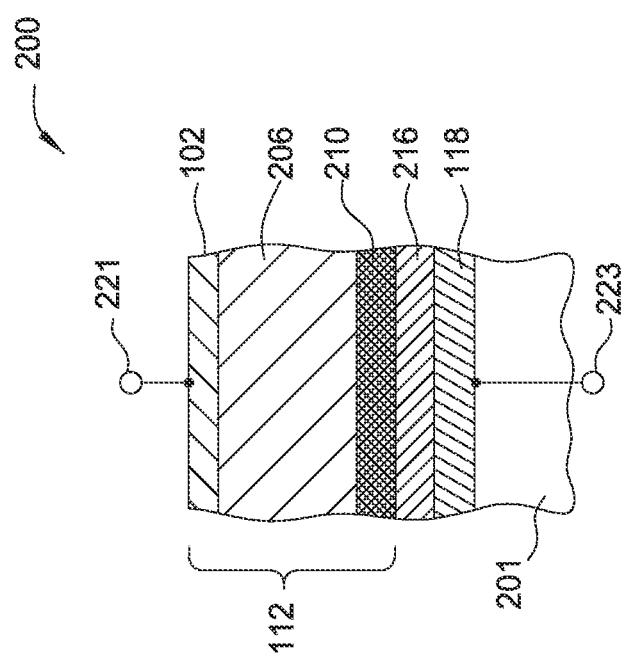
FIG. 4 is a schematic side cross-sectional view of a standard memory element disposed in a nonvolatile memory device.

FIG. 4 is a schematic side cross-sectional view of a standard un-optimized switching memory device 200, which contains a memory element 112 and a current steering device 216 (e.g., a diode) that is formed over a substrate 201. In this configuration, the memory element 112 generally contains a top electrode 102, resistive switching layer 206 and intermediate electrode 210. The electrodes 102, 210, and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The resistive switching layer 206 can be a dielectric material, such as a metal oxide material or other similar material that can be switched between at least two or more stable resistive states.

While the current steering device 216 may include two or more layers of semiconductor material that are adapted to control the flow of current through the formed memory device 200, the resistance of each of the components in the current steering device 216 are not individually discussed herein to minimize the complexity of the discussion, and thus an overall current steering device resistance $R_{CSD}$ is used to represent the overall impedance of the current steering device 216.

Some embodiments use a resistive switching layer comprising multiple sub-layers having differing average defect concentration. By controlling the average defect concentration in each sub-layer of the resistive switching layer 206, such as by forming the multiple sub-layers with different ALD processes during the layer formation process, the minimum switching currents can be adjusted. In some embodiments, the high and low resistance states of the resistive switching layer 206 may be about 2.5 MΩ and about 100 kΩ, respectively.

Figure 5:
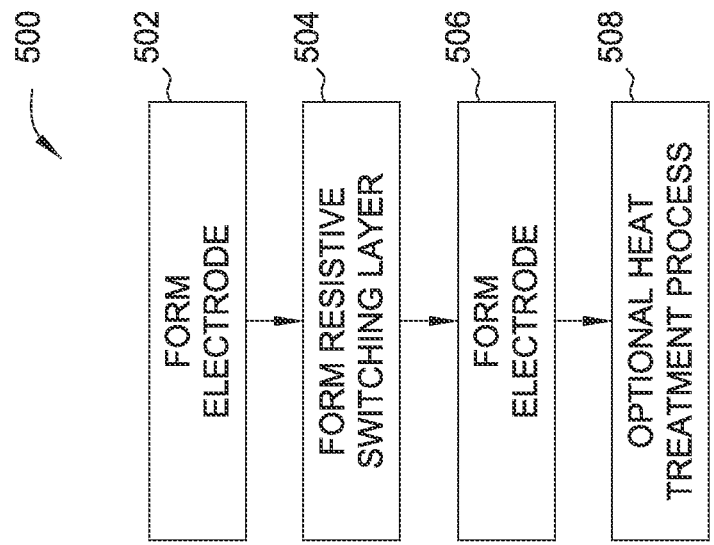
FIG. 5 is a schematic depiction of a process for forming the switching memory device.

FIG. 5 is a flow diagram of a forming process 500 for forming the switching memory device 200, according to some embodiments. Although the method steps are described in conjunction with memory device 200 in FIG. 4, persons skilled in the art will understand that formation of other resistive switching memory devices using forming process 500 is possible. It is also noted that the process for forming the current steering device is not shown in FIG. 5.

Forming process 500 begins at step 502 in which an electrode is formed on or over substrate 201, which may be electrode 118 or intermediate electrode 210. The electrodes 102, 210, and 118 are generally formed from a conductive material, such as a highly conductive semiconductor material (e.g., p-type polysilicon, n-type polysilicon) and/or metal (e.g., TiN, Al, W). In some embodiments, electrodes 118 or 210 are a highly doped polysilicon layers that are formed on or over substrate 201 using a conventional CVD or ALD type polysilicon deposition technique. In some embodiments, electrode 118 and/or electrode 210 comprises polysilicon, and is between about 50 and about 5000 Å thick.

In step 504, resistive switching layer 206 is formed on or over an electrode, such as electrode 118 or intermediate electrode 210, using one or more deposition processes. Resistive switching layer 206 comprises a dielectric material that can be switched between two or more stable resistive states. Resistive switching layer 206 has a thickness of between about 10 and about 100 Å. Numerous materials have been explored for possible use in resistive switching layers for nonvolatile resistive memory devices, including various oxides, e.g. aluminum oxide and silicon oxide, and all of the transition metals, i.e., hafnium (Hf), zirconium (Zr), titanium (Ti), tantalum (Ta), and the like. Resistive switching layer 206 may also include a metal nitride, a metal oxide-nitride, a two-metal oxide-nitride, or a multilayer stack thereof. Two-metal oxides, such as HfAlOx, HfSiOx, and HfTiOx, may also be used as the material for the resistive switching layer.

Metal nitrides suitable for use as a resistive switching layer 206 include $HfN_x$, $ZrN_x$, $SiN_x$, $AlN_x$, $TiN_x$, $V_xN_y$ (e.g., $V_2N$), $NbN_x$ (e.g. $Nb_2N$, $Nb_4N_3$, $NbN$), $WN_x$ (e.g., $WN_2$), among others. Suitable metal nitrides can be formed by atomic layer deposition (ALD) processes according to embodiments.

Metal oxide-nitrides suitable for use as resistive switching layer 206 include $HfO_xN_y$, $ZrO_xN_y$, $AlO_xN_y$, and $TaO_xN_y$, among others. As used herein, the term "metal oxide-nitride" refers to a material that is a combination of metal oxides and metal nitrides, in contrast with metal oxynitrides, in which the metallic chemical element is bonded with the ON structure. In embodiments described, such metal oxide-nitride films can be deposited in various ALD processes (described below in conjunction with FIGS. 6A-9).

Two-metal oxide-nitrides suitable for use as resistive switching layer 206 have two metallic or semi-metallic elements and include films such as: $Hf_xSi_yO_zN_{(1-x-y-z)}$, $Zr_xSi_yO_zN_{(1-x-y-z)}$, $Hf_xZr_yO_zN_{(1-x-y-z)}$, and $Hf_xAl_yO_zN_{(1-x-y-z)}$. Two-metal oxide-nitrides may be deposited by a series of ALD processes similar to that used for the deposition of metal oxide-nitrides. Such ALD processes are described below in conjunction with FIGS. 6A-9. Suitable metals for such two-metal oxide-nitrides include hafnium (Hf), zirconium (Zr), aluminum (Al), tantalum (Ta), titanium (Ti), vanadium (V), niobium (Nb), and tungsten (W) and suitable semi-metallic elements include silicon (Si).

Embodiments include various methods of depositing resistive switching layer 206, and depend in part on the specific composition of and average concentration of defects in resistive switching layer 206. Exemplary methods of depositing resistive switching layer 206 are described below in conjunction with FIGS. 6A-9.

In step 506, electrode 102 is formed above resistive switching layer 206 as shown in FIG. 4 using one or more of the materials suitable for electrode 102 listed above in conjunction with FIG. 4. Electrode 102 may be formed using a deposition process, such as a PVD, CVD, ALD or other similar process. In some embodiments, electrode 102 is between about 500 Å and 1 μm thick.

In step 508, formed memory device 200 is optionally thermally processed, e.g., via an anneal process. Temperature and duration of the anneal process is a function of the configuration of memory device 200 as well as the materials included in memory device 200. For example, in some embodiments, the anneal process takes place at a temperature of greater than about 550° C., such as 750° C. In other embodiments, the anneal process takes place at a temperature of greater than about 600° C. In yet other embodiments, the anneal process takes place at a temperature of greater than about 1000° C. Duration of the anneal process can also vary greatly, e.g. varying between about 30 seconds and 20 minutes depending on the configuration of memory device 200. Furthermore, vacuum anneals, oxygen anneals, anneals using gas mixtures, such as a hydrogen/argon mixture, and other anneal processes known in the art are within the scope of embodiments described herein. Similarly, multiple thermal processing steps may be performed on memory device 200. For example, in some embodiments a thermal process may be performed during or after multiple steps of forming method 500. The process(es) performed at step 508, are generally configured to cause the layers disposed in the switching memory device 200 to form a desirable interface between adjacent layers as well as activate and/or desirably process the other layers formed in the switching memory device.

As noted above, resistive switching layer 206 may comprise a metal oxide, a metal nitride, a two-metal oxide, a metal oxide-nitride, a two-metal oxide-nitride, or a multilayer stack thereof. The resistive switching layer 206 may be custom tailored to include a desired average concentration of defects at various film depths described in conjunction with FIGS. 6A-6B and 8A-8B. Tailoring the average concentration of defects versus the depth of the resistive switching layer 206 may be achieved by forming the resistive switching layer 206 according to various embodiments, including a "saturated/unsaturated deposition" process, described in conjunction with FIG. 7A; a "variable oxidizer/nitridizer" process, described in conjunction with FIG. 7B; a "variable metal precursor" process described in conjunction with FIG. 7C; and combination of the three processes, described in conjunction with FIG. 9.

Resistive Switching Layer Formation Processes

FIG. 6A schematically illustrates a cross-sectional view of a resistive switching layer 206 formed according to the process(es) described herein. The resistive switching layer 206 may be formed using the processes shown in FIGS. 7A-7C. As shown, resistive switching layer 206 includes multiple sub-layers 601, 602, and 603. Each sub-layer is formed with a different average defect concentration in order to tailor the defect concentration versus the depth of the resistive switching layer 206. FIG. 6B is a graph illustrating the relative average concentration of defects and/or oxygen vacancies versus film depth of the resistive switching layer formed. A first sub-layer 601 is formed on bottom electrode 118 by a first ALD process to provide a desired average concentration of defects in first sub-layer 601. A second sub-layer 602 is formed on the first sub-layer 601 by a second ALD process to provide a desired average concentration of defects in second sub-layer 602. In this embodiment, the average concentration of defects in the first sub-layer 601 is more than the average concentration of defects in second sub-layer 602 as shown in FIG. 6B. A third sub-layer 603 may be formed on the second sub-layer 602 by a third ALD process to provide a desired average concentration of defects in the third sub-layer 603. In this embodiment the third sub-layer 603 has a greater average concentration of defects than the second sub-layer 602 as shown in FIG. 6B.

Sub-layers 601-603 shown in FIG. 6A may be metal oxide ($MO_x$) layers having different properties. In some embodiments, one or more of the sub-layers 601-603 may be a metal nitride layer ($MN_x$), metal oxide-nitride layer ($MO_xN_y$), or a two-metal oxide-nitride layer ($M1_xM2_yO_zN_{(1-x-y-z)}$). According to different embodiments, resistive switching layer 206 includes multiple sub-layers of metal oxide ($MO_x$), metal nitride ($MO_xN_y$), metal oxide-nitride ($MO_xN_y$), or a two-metal oxide-nitride ($M1_xM2_yO_zN_{(1-x-y-z)}$) or combinations thereof, where the metal contained therein may be any metal suitable for use as resistive switching layer 206 in memory device 200, including hafnium (Hf), zirconium (Zr), aluminum (Al), tantalum (Ta), titanium (Ti), vanadium (V), niobium (Nb), tungsten (W), and the like. For clarity, the discussion of the resistive switching layer 206 in FIG. 6A describes the multiple sub-layers 601-603 as a metal oxide ($MO_x$) although other types of materials may be used to form the sub-layers 601-603. In some embodiments, the first sub-layer 601 may be a defective metal oxide layer, such as a defective aluminum oxide, the second sub-layer 602 may be a hard metal oxide layer, such as a hard aluminum oxide having few defects, and the third sub-layer 603 may be another defective metal oxide layer, such as a defective aluminum oxide. A defective layer generally means that the layer has a high leakage current, resulting in high power consumption of the device. The hard oxide layer may serve as current limiting type layer. In that way, the combination of sub-layers 601-603 takes advantage of the high leakage current exhibited by the defective aluminum oxide layer with some degree of current limiting ability exhibited by the hard oxide layer, which combination enables switching resistance states with less power. Thus, the resistive switching layer 206 formed combines the two advantages of a high leakage current layer with a current limiting layer.

Sub-layers 601-603 are formed using different ALD processes for each sub-layer 601-603 in order to tailor the average concentration of defects in each sub-layer. Generally, the different ALD processes may be selected from the following combinations: a first combination wherein a saturated ALD process is selected for forming one sub-layer and an unsaturated ALD process is selected for forming a different sub-layer; a second combination wherein an ALD process having a first oxidizer/nitridizer is selected for forming one sub-layer and an ALD process having a second oxidizer/nitridizer different from the first oxidizer/nitridizer is selected for forming a different sub-layer, where the oxidizers/nitridizers have different strengths; and a third combination wherein an ALD process having a first metal precursor is selected for forming one sub-layer and another ALD process having a second metal precursor different from the first metal precursor is selected for forming a different sub-layer.

Forming the sub-layers 601-603 may be achieved by using a single combination of process condition and process component variables to tailor the average concentration of defects for each sub-layer. In some embodiments, sub-layer 601 may be formed with an unsaturated ALD process, sub-layer 602 may be formed with a saturated ALD process, and sub-layer 603 may be formed with a saturated ALD process. Alternatively, multiple process condition and process component variables from each combination may be used to form the sub-layers 601-603 in order to tailor the average concentration of defects for each sub-layer 601-603. In some embodiments, sub-layer 601 may be formed with an unsaturated ALD process having a first oxidizer, sub-layer 602 may be formed with a saturated ALD process having a first oxidizer, and a third sub-layer 603 may be formed with an ALD process having a second oxidizer. Thus, when a first or second ALD process is selected from the above combinations, a third ALD process may comprise on of the following options: a first option wherein the third ALD process is a saturated or an unsaturated ALD process; a second option wherein the third ALD process comprises an oxidizer/nitridizer different from the oxidizer/nitridizer of the first or the second ALD processes; a third option wherein the third ALD process comprises a metal precursor different from the metal precursor of the first or second ALD process.

Many different process condition and process component variable combinations are possible in order to tailor the average concentration of defects in each sub-layer as desired. Each type of variable combination will be discussed below with regards to FIGS. 7A-7C to show different ways to achieve a desired average defect concentration gradient profile shown in FIG. 6B. It should be noted that the average defect concentration gradient profiles shown in FIGS. 6B and 8B and the various ALD processes used to achieve those profiles are only exemplary. A person of ordinary skill in the art will appreciate that other gradient profiles may also be achieved using different variable combinations. Moreover, the discussion below in conjunction with FIGS. 6A-9 are merely exemplary, as other types of sub-layers may be formed using various ALD methods and precursors and oxidizers/nitridizers. For simplicity however, the particular examples discussed in conjunction with FIGS. 6A-9 are for forming aluminum oxide sub-layers.

Figure 7A:
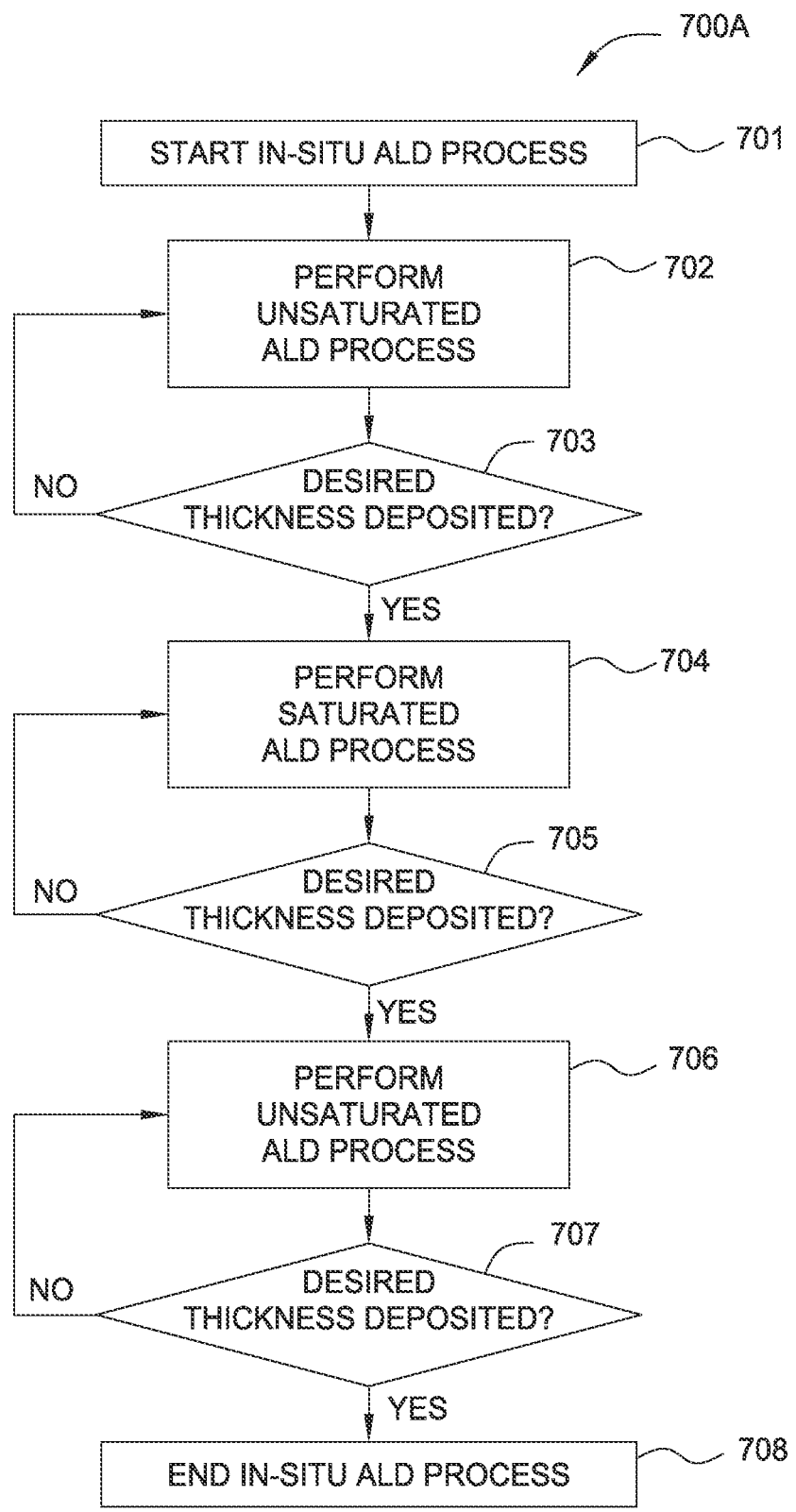
FIG. 7A is a schematic depiction of an ALD process for forming a resistive switching layer.

FIG. 7A is a schematic depiction of an ALD process (method) 700A for forming a resistive switching layer using saturated and unsaturated ALD processes to form each sub-layer 601-603. Each sub-layer may be formed using an in-situ ALD process, i.e. the ALD processes performed all take place successively in a single process chamber. In method 700A, the overall ALD process begins at step 701 during which a metal layer is formed on a suitably prepared and activated surface. The metal layer is formed by exposure of the prepared and activated surface of electrode 118 to a saturated or unsaturated process having one or more suitable precursors.

A saturated ALD process is one in which the number of precursor reactive constituents available to react with the surface of the substrate in the processing chamber reach and complete all the available reactions with the surface of the substrate that can take place at the process conditions used, i.e., it is not reactant limited, so that a complete layer of new material will be formed on the surface. A film that has formed over the substrate surface in a saturated ALD process can no longer grow or become thicker once all the surface reaction sites have been in contact with and reacted with the precursors, even if there are additional unreacted precursors available to react. Thus, a saturated ALD process means the maximum amount of film growth occurs on the substrate surface for that particular reaction type at the particular process conditions (flows, temperature, pulse times, etc.) For example, a saturated process may still form a film on a substrate that may not have 100% coverage of the substrate (leaving defects), but the film will have fewer defects than a film layer produced by a non saturated process (i.e., shorter cycle or pulse times) having the same precursors and reactants.

An unsaturated ALD process is one in which an insufficient number of precursor reactive constituents are available to react with the surface of the substrate, and thus the process is reactant limited and an incomplete or partial layer of new material will be formed on the underlying surface. Thus, a new layer formed using an unsaturated ALD process will have some holes or voids or open areas in the new layer. It is believed that the voids and such formed in the layer on the substrate surface are what introduce the defects or vacancies into the deposited film.

Saturation levels may be altered by controlling the amount of precursor reactive constituents that are permitted to flow to the process chamber such as by having high precursor flow rates, e.g., high metal precursor flow rates (metal rich), compared to oxidation/nitridation flow rates and vice-versa and/or increasing the residence time, i.e. the pulse time of the precursors. Increasing the flow rate of the oxidation/nitridation reactants or pulse time of the precursors causes more material to be formed on the substrate surface in order to cover the entire surface with the new material layer and thus saturates the ALD process. Alternatively, decreasing the pulse time or providing a "metal rich" process by either increasing metal precursor flow rate or decreasing the oxidation/nitridation reactant flow rate renders the ALD process unsaturated. Higher temperatures (below decomposition temperatures) can allow further reaction to reduce the number of unreacted ligands on the surface, further increasing deposition rate and film quality (reduction in C and H content and closer to stoichiometric composition).

A saturated and an unsaturated ALD process may be further illustrated using the example below of forming an aluminum oxide using an aluminum precursor and an oxidizer. In an unsaturated ALD process, only a portion of the aluminum precursor gets converted to an oxide when there is an insufficient amount of oxidizer for the reaction to completely consume the aluminum precursor and form aluminum oxide at all available reactive locations along the substrate surface. Thus, a lot of aluminum precursor molecules do not form a bond with oxygen, thereby leaving oxygen vacancies in the formed film. In a saturated ALD process, the aluminum precursor gets converted to an oxide because of sufficient amounts of oxidizer available to react with the aluminum precursor and with the substrate surface, thereby forming a "complete" aluminum oxide layer.

In step 702, a first ALD process is performed in order to form sub-layer 601. The ALD processes discussed herein typically include the following cycle: flowing a precursor into the processing chamber for a certain pulse time, purging the precursor from the processing chamber for a certain time, flowing a reactant into the processing chamber for a certain pulse time, and purging the reactant from the processing chamber for a certain time. Some ALD cycles may not include each purge step, however, depending on the type of precursors, reactants, and the desired process conditions. The first ALD process is an unsaturated process. In some embodiments, the unsaturated process may comprise flowing a metal precursor for a certain pulse time followed by flowing an oxidizer for a certain pulse time. The metal precursor pulse time, may be between about 0.2 and 30.0 seconds, such as 1.0 seconds. The oxidizer pulse time may be between about 0.1 and 20.0 seconds, such as from 0.3 to 0.5 seconds. The overall process cycle time for any of the ALD processes may typically be between about 2 to about 120 seconds, including precursor/reactant delivery steps and purging of both steps—depending on the chemistry and hardware limitations. A first monolayer of metal oxide is thereby deposited on the electrode 118 to begin formation of the first sub-layer 601. After one or more monolayers are formed, the determination is made in step 703 whether or not the desired thickness of first sub-layer 601 has been reached. Because an ALD process is used to deposit the sub-layers 601-603 in method 700A, each sub-layer 601-603 is formed by depositing one or more layers on the order of a single monolayer in thickness. Consequently, in order to form sub-layer 601 with a suitable thickness, (e.g., 10 to 100 Å), multiple cycles of step 702 are generally performed, (e.g., 2 to 20 or more). As multiple cycles of an unsaturated ALD process are performed, each incomplete or partial layer formed during each unsaturated cycle will have some voids in the layer as previously discussed. Subsequent ALD processes generally do not fill in any defects and/or voids formed in the previously formed layer(s) because the atomic and/or molecular structure of the each layer tends to be misaligned geometrically with each subsequent layer, thereby preventing any "perfect gaps" for new atoms to bind with and fill in the voids formed in the previously formed layer. Thus, subsequent ALD cycles tend not to fill in voids in previously formed layers.

If the requisite number of monolayers has been deposited during the first ALD process, method 700A proceeds to step 704 to begin the second ALD process. If not, method 700A proceeds back to step 702. In some embodiments, for the deposition of an aluminum oxide sub-layer, the metal precursor may be trimethylaluminum (TMA) and the oxidizer may be water ($H_2O$). The TMA pulse time may be between about 0.1 seconds and about 1.0 seconds, such as 0.3 seconds. The water pulse time may be between about 0.1 seconds to about 2.0 seconds, such as 0.3 seconds. 10 ALD cycles may be performed in order to achieve a desired thickness. 10 ALD cycles may be performed in order to achieve a desired thickness, though the exact number of ALD cycles performed will depend on the desired thickness of each sub-layer. As shown in FIGS. 6A and 6B, a sub-layer 601 having a greater average defect concentration may be formed using an unsaturated ALD process.

In step 704, a second ALD process is performed for forming second sub-layer 602. The second ALD process is a saturated ALD process. In some embodiments, the saturated process may comprise flowing a metal precursor for certain pulse time followed by flowing an oxidizer for a pulse time that is longer than the pulse time for the oxidizer in the first ALD process. As previously discussed, increasing the residence time of the precursors in the process chamber is one way of providing a saturated ALD process. A first monolayer of metal oxide is thereby deposited on the first sub-layer 601 to begin formation of the second sub-layer 602. After one or more monolayers are formed, the determination is made in step 705 whether or not the desired thickness of second sub-layer 602 has been reached. In order to form sub-layer 602 with a suitable thickness, (e.g., 10 to 100 Å), multiple cycles of step 704 are generally performed, (e.g., 2 to 20 or more). If the requisite number of monolayers has been deposited during the second ALD process, method 700A proceeds to step 706 to begin the third ALD process. If not, method 700A proceeds back to step 704. In some embodiments, for the deposition of a hard aluminum oxide sub-layer, the metal precursor may be trimethylaluminum (TMA) and the oxidizer may be water ($H_2O$). The TMA pulse time may be between about 0.3 to about 2.0 seconds, such as 1.0 seconds, and the water pulse time may be between about 0.3 to about 3.0 seconds, such as 1.0 seconds. A total of 10 ALD cycles may be performed in order to achieve a desired thickness. As shown in FIGS. 6A and 6B, a sub-layer 602 having a lower average concentration of defects than sub-layer 601 may be formed using a saturated ALD process. Some precursors are harder to deliver to the processing chamber, and thus, the pulse times may be 30 seconds or greater. Some examples of hard to deliver precursors include $HfCl_4$ or large molecules such as zirconium based precursors.

In step 706, a third ALD process is performed for forming the third sub-layer 603. The third ALD process may be a saturated or an unsaturated ALD process when at least one of the first or the second ALD processes is saturated differently than the third ALD process. In other words, if the means of controlling the average concentration of defects in each sub-layer is by controlling the saturated/unsaturated level of the ALD processes, then at least two of the ALD processes used to form each sub-layer must have differing saturation levels.

In the example of some embodiments shown in step 706, the third ALD process is an unsaturated ALD process, which may be the same or similar to the first ALD process in step 702. In some embodiments, the unsaturated process may comprise flowing a metal precursor for a certain pulse time followed by flowing an oxidizer for a certain pulse. A first monolayer of metal oxide is thereby deposited on the second sub-layer 602 to begin formation of the third sub-layer 603. After one or more monolayers are formed, the determination is made in step 707 whether or not the desired thickness of third sub-layer 603 has been reached. In order to form sub-layer 603 with a suitable thickness, (e.g., 10 to 100 Å), multiple cycles of step 706 are generally performed, (e.g., 2 to 20 or more). If the requisite number of monolayers has been deposited during the third ALD process, method 700A proceeds to step 708, ending the overall in-situ ALD process. If not, method 700A proceeds back to step 706. In some embodiments, for the deposition of an aluminum oxide sub-layer, the metal precursor may be trimethylaluminum (TMA) and the oxidizer may be water ($H_2O$). The TMA pulse time may be between about 0.1 seconds and about 1.0 seconds, such as 0.3 seconds. The water pulse time may be between about 0.1 seconds to about 2.0 seconds, such as 0.3 seconds. 10 ALD cycles may be performed in order to achieve a desired thickness. As shown in FIGS. 6A and 6B, a sub-layer 603 having a greater average concentration of defects than sub-layer 602 may be formed using an unsaturated ALD process. A comparison of the average concentration of defects in the first sub-layer, the second sub-layer, and the third sub-layer shows a average defect concentration gradient between sub-layers as shown in FIGS. 6A and 6B. In some embodiments, an optional purge process may be performed to remove residual precursors and oxidizers/nitridizers from the ALD chamber before, after, or during any ALD cycle of each step 702, 704, and 706 or at the conclusion of each step 702, 704, and 706.

In some embodiments, the pulse time may be increased or decreased for each monolayer within each ALD process so that each monolayer will be formed at different saturation points with each cycle. In some embodiments, the first ALD process may begin as a saturated ALD process cycle and third ALD process end as an unsaturated ALD process cycle. In one particular example of some embodiments, the first ALD process 702 may be completely saturated by using an oxidation pulse time of 2.0 seconds. The oxidation pulse time in each subsequent cycle in the first ALD process, as well as the subsequent cycles in the second and third ALD processes will be incrementally decreased until the final oxidation pulse time in the third ALD process 706 is 0.2 seconds, thereby providing ALD processes that are less and less saturated when forming the sub-layers 601-603. Changing each ALD process cycle to move from saturated to unsaturated increases the average concentration of defects in the resistive switching layer 206 as the film thickness increases.

Figure 7B:
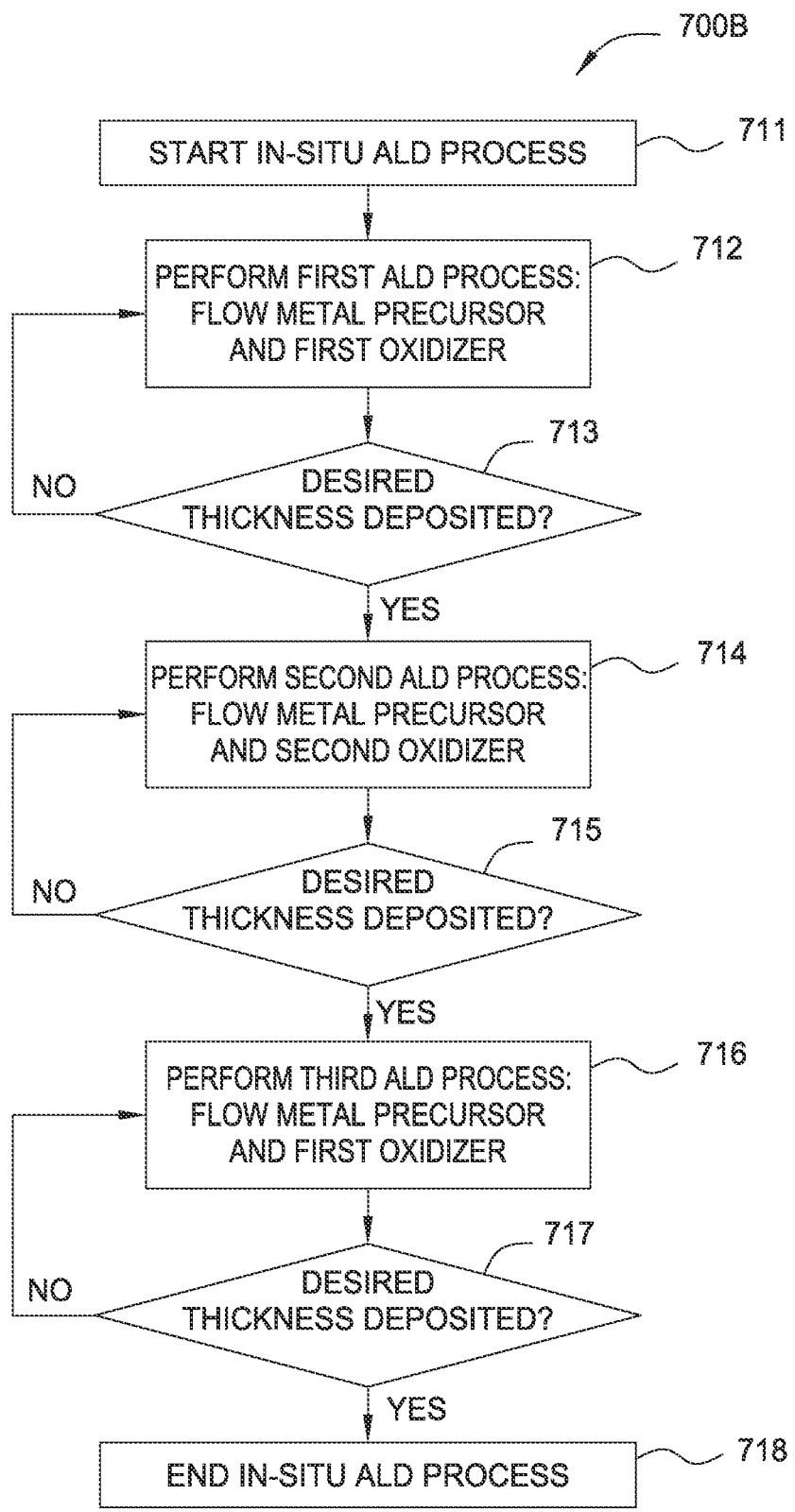
FIG. 7B is a schematic depiction of an ALD process for forming a resistive switching layer.

FIG. 7B is a schematic depiction of an ALD process 700B for forming a resistive switching layer 206 using a first oxidizer/nitridizer and a second oxidizer/nitridizer different than the first oxidizer/nitridizer in the ALD processes for forming each sub-layer 601-603. The overall ALD process begins at step 711 during which a metal layer is formed on a suitably prepared and activated surface. The metal layer is formed by exposure of the prepared and activated surface of electrode 118 to a process having one or more suitable precursors including different oxidizers and/or nitridizers. The oxidizers and nitridizers are chosen according to their strength as an oxidizer and/or nitridizer. Using different oxidizers and nitridizers during each sub-layer 601-603 formation process will result in deposited films with different average concentrations of defects and oxygen vacancies. Alternating different oxidizers and/or nitridizers in the ALD processes enables control of the process in order to grow films with defects and oxygen vacancies that are optimized to ReRam switching performance. Some suitable examples of oxidizers include ozone ($O_3$), water ($H_2O$), and alcohols (R—OH). Generally in that group, ozone is the strongest oxidizer and alcohols are the weakest oxidizer. Some suitable examples of nitridizers include $N_2$, $N_2H_2$, $NH_3$, and $NH_3$ plasma. Generally, it is believed that an $NH_3$ plasma will be strongest, followed by $N_2H_2$ and $NH_3$ being comparable, with N2 being the weakest. $N_2$ may be used in either an anneal or a plasma to form the nitride or oxynitride. Oxynitrides may be preferred for switching as oxygen vacancies are believed to be the dominant method for switching while the nitride helps change the characteristics of the film. For example, it is believed that HfN is more conductive, thus a HfON film will benefit some from the oxygen by perhaps having a lower forming voltage.

In step 712, a first ALD process is performed in order to form sub-layer 601. The first ALD process comprises flowing a metal precursor and a first oxidizer. It should be noted that although these examples of some embodiments shown in FIG. 7B only explicitly discuss using oxidizers, nitridizers may also be used. In some embodiments, the process may comprise flowing a metal precursor followed by flowing a weak oxidizer compared to the second oxidizer used in the second ALD process 714. A first monolayer of metal oxide is thereby deposited on the electrode 118 to begin formation of the first sub-layer 601. After one or more monolayers are formed, the determination is made in step 713 whether or not the desired thickness of first sub-layer 601 has been reached. In order to form sub-layer 601 with a suitable thickness, (e.g., 10 to 100 Å), multiple cycles of step 712 are generally performed, (e.g., 2 to 20 or more). If the requisite number of monolayers has been deposited during the first ALD process, method 700B proceeds to step 714 to begin the second ALD process. If not, method 700B proceeds back to step 712. In an example of some embodiments, for the deposition of an aluminum oxide sub-layer, the metal precursor may be trimethylaluminum (TMA) and the oxidizer may be water ($H_2O$). The TMA pulse time may be between about 0.1 seconds and about 1.0 seconds, such as 0.3 seconds. The water pulse time may be between about 0.1 seconds and about 2.0 seconds, such as 0.3 seconds. About 10 ALD cycles may be performed in order to achieve a desired thickness. As shown in FIGS. 6A and 6B, a sub-layer 601 having a greater average concentration of defects may be formed using a first oxidizer in the first ALD process 712 that is weaker than a second oxidizer used in the second ALD process 714.

In step 714, a second ALD process is performed for forming a second sub-layer 602. The second ALD process comprises flowing a metal precursor followed by flowing a second oxidizer different than the first oxidizer. In some embodiments, the process may comprise flowing a metal precursor with a strong oxidizer compared to the first oxidizer used in the first ALD process 712. A first monolayer of metal oxide is thereby deposited on the first sub-layer 601 to begin formation of the second sub-layer 602. After one or more monolayers are formed, the determination is made in step 715 whether or not the desired thickness of second sub-layer 602 has been reached. In order to form sub-layer 602 with a suitable thickness, (e.g., 10 to 100 Å), multiple cycles of step 714 are generally performed, (e.g., 2 to 20 or more). If the requisite number of monolayers has been deposited during the second ALD process, method 700B proceeds to step 716 to begin the third ALD process. If not, method 700B proceeds back to step 714. In one example of some embodiments, for the deposition of a hard aluminum oxide sub-layer, the metal precursor may be trimethylaluminum (TMA) and the oxidizer may be ozone ($O_3$). The TMA pulse time may be between about 0.1 seconds and 5.0 seconds, such as 1.0 second. The ozone pulse time may be between about 0.5 seconds and 30.0 seconds, such as about 10.0 seconds. 10 ALD cycles may be performed in order to achieve a desired thickness. As shown in FIGS. 6A and 6B, a sub-layer 602 having a lower average concentration of defects than sub-layer 601 may be formed using a second oxidizer in the second ALD process 714 that is stronger than a first oxidizer used in the first ALD process 712.

In step 716, a third ALD process is performed for forming the third sub-layer 603 shown in FIG. 6A. The third ALD process comprises flowing a metal precursor into the process chamber followed by flowing an oxidizer into the process chamber, which oxidizer may be the same or similar to the oxidizer used in the first ALD process in step 712 or the second ALD process used in step 714. In some embodiments, the process may comprise flowing a metal precursor followed by flowing a weak oxidizer compared to the second oxidizer used in the second ALD process. A first monolayer of metal oxide is thereby deposited on the second sub-layer 602 to begin formation of the third sub-layer 603. After one or more monolayers are formed, in step 717, the determination is made whether or not the desired thickness of third sub-layer 603 has been reached. In order to form sub-layer 603 with a suitable thickness, (e.g., 10 to 100 Å), multiple cycles of step 716 are generally performed, (e.g., 2 to 20 or more). If the requisite number of monolayers has been deposited during the third ALD process, method 700B proceeds to step 718, ending the overall in-situ ALD process. If not, method 700B proceeds back to step 716. In one example of some embodiments, the metal precursor may be trimethylaluminum (TMA) and the oxidizer may be water ($H_2O$) for the deposition of an aluminum oxide sub-layer. The TMA has a pulse time of between about 0.1 seconds and 1.0 seconds, such as 0.3 seconds. The water has a pulse time from about 0.1 seconds to about 2.0 seconds, such as 0.3 seconds. 10 ALD cycles may be performed to achieve a desired thickness. As shown in FIGS. 6A and 6B, a sub-layer 603 having a greater average concentration of defects than sub-layer 602 may be formed using an oxidizer in the third ALD process 716 that is weaker than a second oxidizer used in the second ALD process 714. A comparison of the average concentration of defects in the first sub-layer, the second sub-layer, and the third sub-layer shows an average defect concentration gradient between sub-layers as shown in FIGS. 6A and 6B. In some embodiments, an optional purge process may be performed to remove residual precursors and oxidizers/nitridizers from the ALD chamber before, after, or during any ALD cycle of each step 712, 714, and 716 or at the conclusion of each step 712, 714, and 716. As FIG. 7B illustrates, alternating the strength of the oxidizer/nitridizer when forming the sub-layers is another way of controlling the average concentration of defects in each sub-layer.

Figure 7C:
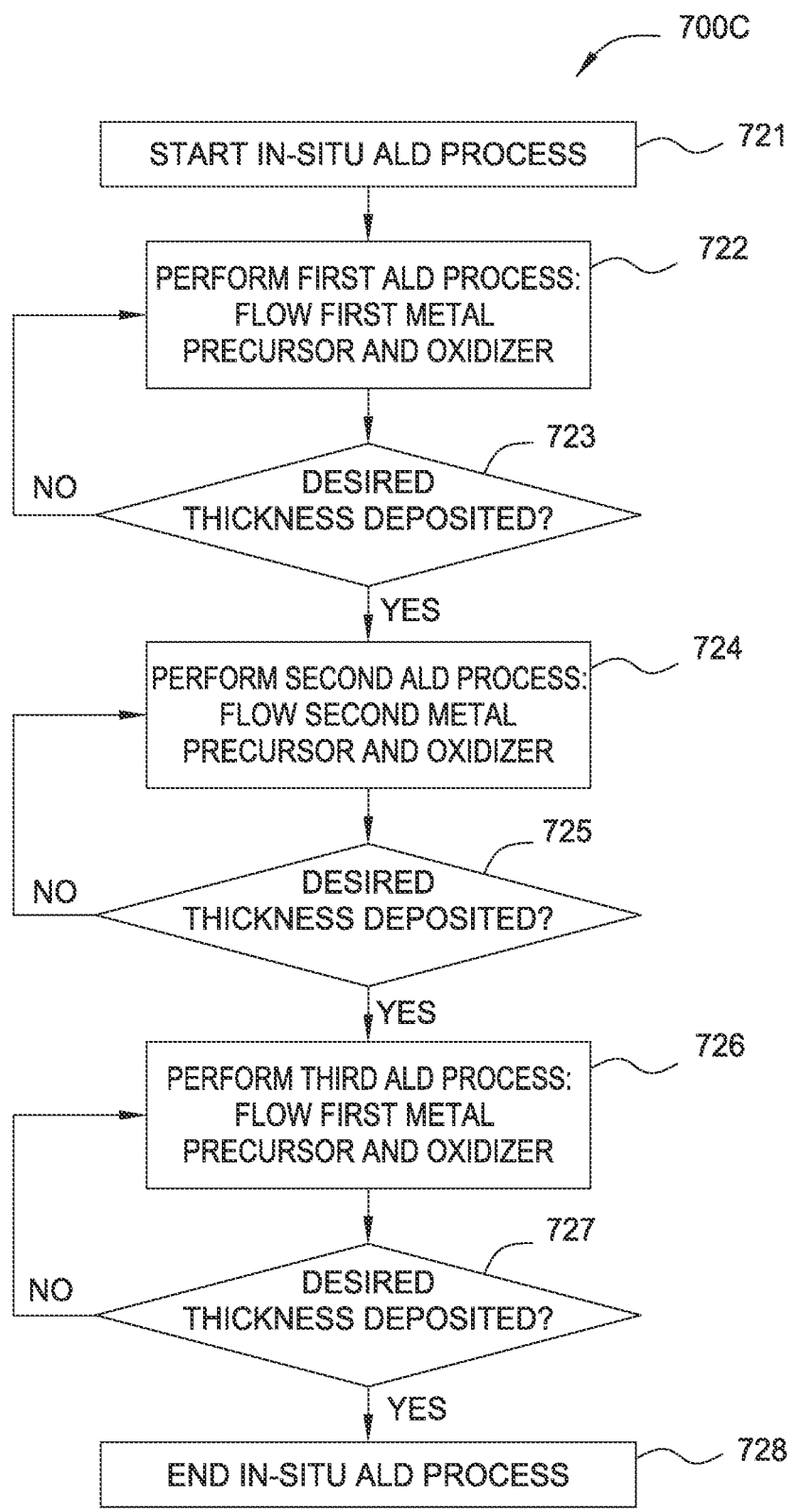
FIG. 7C is a schematic depiction of an ALD process for forming a resistive switching layer.

FIG. 7C is a schematic depiction of an ALD process 700C for forming a resistive switching layer 206 according to some embodiments using a first metal precursor and a second metal precursor different than the first in the ALD processes for forming each sub-layer 601-603. The overall ALD process begins at step 721 during which a metal layer is formed on a suitably prepared and activated surface. The metal layer is formed by exposure of the prepared and activated surface of electrode 118 to a process having one or more suitable precursors including different metal precursors. The metal precursors may be chosen according their ability to provide differing amounts of carbon in the formed films. It is believed that the amount of carbon formed in a film may determine the average concentration of defects and oxygen vacancies in the oxide or nitride film used as part of the resistive switching layer 206. For example, by increasing the amount of carbon in a film, more defects and oxygen vacancies may be formed in a film. Alternatively, when forming a film with little or no carbon content, the film is less likely to have defects and oxygen vacancies. Thus, using different metal precursors during each sub-layer 601-603 formation process will result in deposited films with different average concentrations of defects and oxygen vacancies. Alternating different metal precursors in different ALD processes enables control of the process to grow films with defects and oxygen vacancies that are optimized to ReRam switching performance. Some suitable examples of metal precursors include trimethylaluminum (TMA), aluminum chloride ($AlCl_3$), and $HfCl_4$. Metal precursors that have no carbon content generally provide deposited films also having little or no carbon content, whereas metal precursors that have carbon content will generally provide deposited films having some carbon content. In an example of some embodiments, using $HfCl_4$ as the precursor for $HfO_2$ films will create a better insulator due to the lack of any carbon in the film.

In step 722, a first ALD process is performed in order to form sub-layer 601. The first ALD process comprises flowing a first metal precursor followed by flowing an oxidizer. It should be noted that although these examples of some embodiments shown in FIG. 7C only explicitly discuss using oxidizers, nitridizers may also be used in some embodiments. A first monolayer of metal oxide is thereby deposited on the electrode 118 to begin formation of the first sub-layer 601. After one or more monolayers are formed, the determination is made in step 723 whether or not the desired thickness of first sub-layer 601 has been reached. In order to form sub-layer 601 with a suitable thickness, (e.g., 10 to 100 Å), multiple cycles of step 722 are generally performed, (e.g., 2 to 20 or more). If the requisite number of monolayers has been deposited during the first ALD process, method 700C proceeds to step 724 to begin the second ALD process. If not, method 700C proceeds back to step 722. In some embodiments, if the first sub-layer 601 is designed to have more defects than the second sub-layer 602, the first metal precursor should be selected to provide a film having a carbon content in the first sub-layer 601 that is greater than the carbon content of the second sub-layer 602. In some embodiments, if the deposition of an aluminum oxide first sub-layer 601 having more defects compared to the second sub-layer 602 is desired, the first metal precursor may be trimethylaluminum (TMA) and the oxidizer may be water ($H_2O$). The TMA pulse time may be between about 0.1 seconds and 1.0 seconds, such as 0.3 seconds. The water pulse time may be between about 0.1 seconds and 2.0 seconds, such as 0.3 seconds. 10 ALD cycles may be performed in order to achieve a desired thickness. Because TMA includes carbon, some of that carbon will be formed in the first sub-layer 601 and provide more defects when compared to the second sub-layer 602. As shown in FIGS. 6A and 6B, the sub-layer 601 has a greater average concentration of defects and may be formed using a first metal precursor in the first ALD process 722 that provides a greater amount of carbon in the deposited film than a second metal precursor used in the second ALD process 724.

In step 724, a second ALD process is performed for forming the second sub-layer 602. The second ALD process comprises flowing a second metal precursor different than the first metal precursor followed by flowing an oxidizer. In some embodiments, the process may comprise flowing a second metal precursor having no carbon content compared to the first metal precursor used in the first ALD process 722. A first monolayer of metal oxide is thereby deposited on the first sub-layer 601 to begin formation of the second sub-layer 602. After one or more monolayers are formed, the determination is made in step 725 whether or not the desired thickness of second sub-layer 602 has been reached. In order to form sub-layer 602 with a suitable thickness, (e.g., 10 to 100 Å), multiple cycles of step 724 are generally performed, (e.g., 2 to 20 or more). In some embodiments, if the second sub-layer 602 is designed to have fewer defects than the first sub-layer 601, the second metal precursor should be selected to provide a film having little or no carbon content in the second sub-layer 602 that is fewer than the carbon content of the first sub-layer 601. In some embodiments, if the deposition of an aluminum oxide second sub-layer 602 having fewer defects compared to the first sub-layer 601 is desired, the second metal precursor may be aluminum chloride ($AlCl_3$) and the oxidizer may be water ($H_2O$). The $AlCl_3$ pulse time may be between about 1.0 seconds and about 30.0 seconds, such as 10.0 seconds. The water pulse time may be between about 0.3 seconds and 2.0 seconds, such as about 0.5 seconds.) 10 ALD cycles may be performed in order to achieve a desired thickness. Because $AlCl_3$ has no carbon content, it is more reactive with the oxidizer, which in this example is water, and the second sub-layer 602 should have little or no carbon content compared to the first sub-layer 601 and thereby provide fewer defects. If the requisite number of monolayers has been deposited during the second ALD process, method 700C proceeds to step 726 to begin the third ALD process. If not, method 700C proceeds back to step 724. As shown in FIGS. 6A and 6B, the second sub-layer 602 has a lower average concentration of defects compared to the first sub-layer 601, and may be formed using a second metal precursor in the second ALD process 714 that provides a lesser amount of carbon in the deposited film than the first metal precursor provides in the deposited film in the first ALD process 722.

In step 726, a third ALD process is performed for forming the third sub-layer 603. The third ALD process comprises flowing an oxidizer and a metal precursor which may be the same or similar to the oxidizer used in the first ALD process in step 722 or the second ALD process used in step 724. In some embodiments, the process may comprise flowing the first metal precursor into the process chamber followed by flowing an oxidizer into the process chamber. A first monolayer of metal oxide is thereby deposited on the second sub-layer 602 to begin formation of the third sub-layer 603. After one or more monolayers are formed, in step 727, the determination is made whether or not the desired thickness of third sub-layer 603 has been reached. In order to form sub-layer 603 with a suitable thickness, (e.g., 10 to 100 Å), multiple cycles of step 726 are generally performed, (e.g., 2 to 20 or more). If the requisite number of monolayers has been deposited during the third ALD process 726, method 700C proceeds to step 728, ending the overall in-situ ALD process. If not, method 700C proceeds back to step 726. In one example of some embodiments, for the deposition of an aluminum oxide sub-layer, the metal precursor may be trimethylaluminum (TMA) and the oxidizer may be water ($H_2O$). The TMA pulse time may be between about 0.1 seconds and about 1.0 seconds, such as 0.3 seconds. The water pulse time may be between about 0.1 seconds to about 2.0 seconds, such as 0.3 seconds. 10 ALD cycles may be performed to achieve a desired thickness. As shown in FIGS. 6A and 6B, a sub-layer 603 having a greater average concentration of defects than sub-layer 602 may be formed using a first metal precursors in the third ALD process 722 that is different than a second metal precursor used in the second ALD process 724 and that provides a greater amount of carbon in the deposited film than the second metal precursor used in the second ALD process 724. A comparison of the average defect concentration in the first sub-layer, the second sub-layer, and the third sub-layer shows an average defect concentration gradient between sub-layers as shown in FIGS. 6A and 6B. In some embodiments, an optional purge process may be performed to remove residual precursors and oxidizers/nitridizers from the ALD chamber before, after, or during any ALD cycle of each step 722, 724, and 726 or at the conclusion of each step 722, 724, and 726. As illustrated in FIG. 7C, alternating the type of metal precursor to control the carbon content of the deposited sub-layers when forming the sub-layers is another way of controlling the average concentration of defects in each sub-layer.

Figure 9:
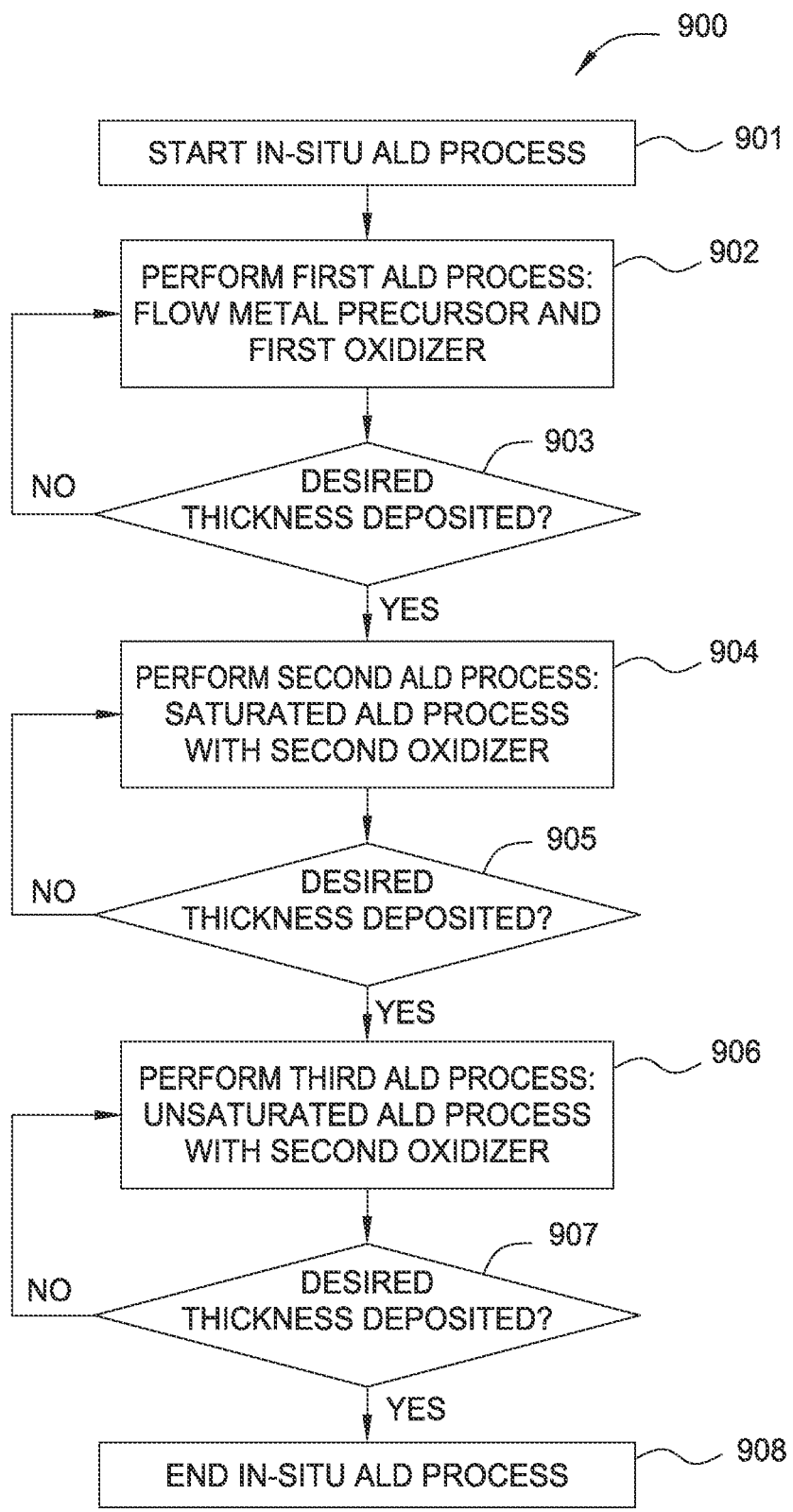
FIG. 9 is a schematic depiction of an ALD process for forming a resistive switching layer.

As shown and discussed in FIGS. 6A-7C, there are multiple combinations of process condition and constituent variables used during ALD processes in order to tailor the average concentration of defects per depth of the resistive switching layer 206, including utilizing saturated and unsaturated ALD processes, utilizing different oxidizers having varying strengths, and utilizing different metal precursors in the ALD processes for forming resistive switching layer 206. Selected process condition and constituent variables from each combination may be used together in order to tailor the average concentration of defects for each sub-layer in the resistive switching layer 206. FIGS. 8A-9 illustrate an example of some embodiments of combining the different process condition and constituent variables from each type of combination process in order to form a defect profile that is different from the defect profile shown in FIG. 6B.

FIG. 8A schematically illustrates a cross-sectional view of a resistive switching layer 206 formed according to some embodiments. The resistive switching layer 206 may be formed using the steps shown in FIG. 9. As shown, resistive switching layer 206 includes multiple sub-layers 801, 802, and 803. Each sub-layer is formed to include a different average defect concentration in order to tailor the average defect concentration versus the depth of the resistive switching layer 206. FIG. 8B is a graph illustrating the average concentration of defects and/or oxygen vacancies versus film depth of the resistive switching layer 206 formed according to an embodiment. A first sub-layer 801 is formed on bottom electrode 118 by a first ALD process to provide a desired average concentration of defects in first sub-layer 801. A second sub-layer 802 is formed on the first sub-layer 801 by a second ALD process to provide a desired average concentration of defects in second sub-layer 802. In this embodiment, the average concentration of defects in the second sub-layer 802 is more than the average concentration of defects in first sub-layer 802 as shown in FIG. 8B. A third sub-layer 803 may be formed on the second sub-layer 802 by a third ALD process in order to provide a desired average concentration of defects in the third sub-layer 803. In this embodiment the third sub-layer 803 has more defects than the second sub-layer 802 as shown in FIG. 8B. Thus, the average defect concentration gradient may be tailored so that the average concentration of defects in the resistive switching layer 206 increases as the film grows away from the electrode 118.

The sub-layers 801-803 shown in FIG. 8A may be metal oxide ($MO_x$) layers having different properties. In some embodiments, one or more of the sub-layers 801-803 may be similar materials as those previously discussed in reference to sub-layers 601-603. The resistive switching layer 206 in FIG. 8A may include multiple sub-layers 801-803 of metal oxide ($MO_x$). In some embodiments, the first sub-layer 801 may be a hard metal oxide layer, such as a hard aluminum oxide, the second sub-layer 802 may be a less defective metal oxide layer, such as a less defective aluminum oxide having few defects, and the third sub-layer 803 may be a very defective metal oxide layer, such as a very defective aluminum oxide layer. In the embodiment shown in FIGS. 8A-8B, the first sub-layer 801, a hard metal oxide, has few defects, the second sub-layer 802, a less defective aluminum oxide, has more defects, and the third sub-layer 803, a very defective metal oxide layer has the most defects. It may be desired to have a hard metal oxide layer formed next to the electrode so that the film next to the electrode does not break down during the repeated switching process from a HRS to a LRS. Thus, a more robust film may be formed next to the upper or lower electrode, such as the electrode 118, with leakier films formed above the robust film that serves as the switching material in the resistive switching layer 206. Ultimately, where the hard metal oxide film is located may depend on the type of electrodes used.

The sub-layers 801-803 are formed using different ALD processes for each sub-layer 801-803 in order to tailor the average concentration of defects in each sub-layer. FIG. 9 is a schematic depiction of an overall ALD process 900 for forming a resistive switching layer according to an embodiment using multiple variables from the different combinations in order to form each sub-layer 601-603. Each sub-layer may be formed using an in-situ ALD process, i.e. the ALD processes performed all take place successively in a single process chamber. In method 900, the overall ALD process includes multiple ALD sub-processes to form each sub-layer 801-803: a first ALD process 902, a second ALD process 904, and a third ALD process 906. The overall ALD process begins at step 901 during which a metal oxide layer is formed on a suitably prepared and activated surface.

In step 902, a first ALD process is performed in order to form sub-layer 801. The first ALD process comprises flowing a metal precursor followed by flowing a first oxidizer different from the second oxidizer used in either the second or third ALD processes 904, 906. In some embodiments, the process may comprise flowing a metal precursor followed by flowing a first oxidizer that is a strong oxidizer compared to the second oxidizer used in the second ALD process 904. A first monolayer of metal oxide is thereby deposited on the electrode 118 to begin formation of the first sub-layer 801. After one or more monolayers are formed, the determination is made in step 903 whether or not the desired thickness of first sub-layer 801 has been reached. In order to form sub-layer 801 with a suitable thickness, (e.g., 10 to 100 Å), multiple cycles of step 902 are generally performed, (e.g., 2 to 20 or more). If the requisite number of monolayers has been deposited during the first ALD process, method 900 proceeds to step 904 to begin the second ALD process. If not, method 900 proceeds back to step 902. In one example of some embodiments, for the deposition of a hard aluminum oxide sub-layer, the metal precursor may be trimethylaluminum (TMA) and the oxidizer may be ozone ($O_3$). The metal precursor pulse time may be between about 0.1 seconds and 5.0 seconds, such as 1.0 seconds. The ozone pulse time may be between about 0.5 seconds and about 30.0 seconds, such as 10 seconds. 10 ALD cycles may be performed in order to achieve a desired thickness. As shown in FIGS. 8A and 8B, a sub-layer 801 having a lower average concentration of defects may be formed using a first oxidizer in the first ALD process 902 that is stronger than a second oxidizer used in the second ALD process 904.

In step 904, a second ALD process is performed for forming second sub-layer 802. In this example of some embodiments, the second ALD process comprises a saturated ALD process with a second oxidizer that is different than the first oxidizer. In some embodiments, the saturated process may comprise flowing a metal precursor followed by flowing a second oxidizer that is weaker than the first oxidizer. Additionally, using a weaker oxidizer will also increase the average concentration of defects compared to a strong oxidizer. A first monolayer of metal oxide is thereby deposited on the first sub-layer 801 to begin formation of the second sub-layer 802. After one or more monolayers are formed, the determination is made in step 905 whether or not the desired thickness of second sub-layer 802 has been reached. In order to form sub-layer 802 with a suitable thickness, (e.g., 10 to 100 Å), multiple cycles of step 904 are generally performed, (e.g., 2 to 20 or more). If the requisite number of monolayers has been deposited during the second ALD process, method 900 proceeds to step 906 to begin the third ALD process. If not, method 900 proceeds back to step 904. In one example of some embodiments, for the deposition of a less defective aluminum oxide sub-layer, the metal precursor may be trimethylaluminum (TMA) and the oxidizer may be water ($H_2O$). The TMA pulse time may be between about 0.3 seconds and 2.0 seconds, such as 1.0 seconds. The water pulse time may be between about 0.3 and 3.0 seconds, such as about 1.0 seconds. 10 ALD cycles may be performed in order to achieve a desired thickness. As shown in FIGS. 8A and 8B, a sub-layer 802 having a greater average concentration of defects than sub-layer 801 may be formed using a saturated ALD process 904 with a second oxidizer that is weaker than the first oxidizer used in the first ALD process 902.

In step 906, a third ALD process is performed for forming the third sub-layer 803. In this example of some embodiments, the third ALD process comprises an unsaturated ALD process with a second oxidizer that is different than the first oxidizer for a pulse time that is shorter than the oxidizer pulse time in the second ALD process. Decreasing the residence time of the reactants in the process chamber is one way of providing an unsaturated ALD process in order to create more defects. A first monolayer of metal oxide is thereby deposited on the second sub-layer 802 to begin formation of the third sub-layer 803. After one or more monolayers are formed, the determination is made in step 907 whether or not the desired thickness of third sub-layer 803 has been reached. In order to form sub-layer 803 with a suitable thickness, (e.g., 10 to 100 Å), multiple cycles of step 806 are generally performed, (e.g., 2 to 20 or more). If the requisite number of monolayers has been deposited during the third ALD process, method 900 proceeds to step 908, ending the overall in-situ ALD process. If not, method 900 proceeds back to step 906. In one example of some embodiments, for the deposition of a very defective aluminum oxide sub-layer, the metal precursor may be trimethylaluminum (TMA) and the oxidizer may be water ($H_2O$). The TMA pulse time may be between about 0.1 seconds and about 1.0 seconds, such as 0.3 seconds. The water pulse time may be between about 0.1 seconds and about 2.0 seconds, such as 0.3. 10 ALD cycles may be performed in order to achieve a desired thickness. As shown in FIGS. 8A and 8B, the sub-layer 803 having a greater average concentration of defects than sub-layer 802 may be formed using an unsaturated ALD process and a second oxidizer that is weaker than the first oxidizer used in the first ALD process. The combination of using a weak oxidizer such as water and a short residence time for the reaction to take place, making it an unsaturated ALD process, greatly increases the average concentration of defects formed in the third sub-layer 803. In some embodiments, an optional purge process may be performed to remove residual precursors and oxidizers/nitridizers from the ALD chamber before, after, or during any ALD cycle of each step 902, 904, and 906 or at the conclusion of each step 902, 904, and 906.

Embodiments described provide the ability to custom tailor the average concentration of defects in a resistive switching layer film versus the depth of the film. A resistive switching layer that has an average defect concentration gradient profile is easier to switch from a HRS to a LRS and vice-versa. By tailoring the distribution of defects in the resistive switching layer, the average defect concentration gradient profile films are easier to switch compared to conventional switching films, even if both films have the same average concentration of defects. Films formed according to embodiments provide a bridge between the two electrodes that is easier to switch between resistive states. Additionally, the films formed according to embodiments may be formed entirely in-situ, thereby simplifying processing steps and decreasing processing times. Moreover, the resistive switching layer formed according to embodiments may combine the advantages of a current limiting layer with a high leakage current layer into a single resistive switching layer.

The foregoing is merely illustrative and various modifications can be made by those skilled in the art without departing from the scope and spirit of the invention as defined by the claims that follow.

The invention claimed is:

1. A method of forming a nonvolatile memory element in a ReRAM device, the method comprising:
    forming a resistive switching layer over a first electrode layer,
the resistive switching layer comprising:
    a first sub-layer deposited using an unsaturated ALD process;
    a second sub-layer deposited using a saturated ALD process, and
    wherein an average concentration of defects in the first sub-layer is less than an average concentration of defects in the second sub-layer; and
    forming a second electrode layer, so that the resistive switching layer is disposed between the first electrode layer and the second electrode layer.

2. The method of claim 1, wherein the unsaturated ALD process and the saturated ALD process are performed in accordance with at least one of the following combinations:
    a first combination wherein the unsaturated ALD process uses a first oxidizer/nitridizer and the saturated ALD process uses a second oxidizer/nitridizer different from the first oxidizer/nitridizer; or
    a second combination wherein the unsaturated ALD process uses a first metal precursor and the saturated ALD process uses a second metal precursor different from the first metal precursor.

3. The method of claim 1, wherein the resistive switching layer further comprises a third sub-layer deposited using a third ALD process, the third layer having less defects than the second sub-layer.

4. The method of claim 3, wherein the third ALD process is performed in accordance with at least one of the following options:
    a first option wherein the third ALD process is a saturated ALD process or an unsaturated ALD process;
    a second option wherein the third ALD process uses an oxidizer/nitridizer different from an oxidizer/nitridizer used in the saturated ALD process and different from an oxidizer/nitridizer used in unsaturated ALD process; or
    a third option wherein the third ALD process uses a metal precursor different from the metal precursor used in the saturated ALD process and different from an oxidizer/nitridizer used in unsaturated ALD process.

5. The method of claim 3, wherein at least one of the first sub-layer, the second sub-layer, or the third sub-layer comprises a metal oxide layer, a two-metal oxide, a metal nitride layer, a metal oxide-nitride layer, a two-metal oxide-nitride layer, or a combination thereof.

6. The method of claim 5, wherein the metal of the metal oxide layer comprises one or more of aluminum (Al), hafnium (Hf), zirconium (Zr), tantalum (Ta), titanium (Ti), vanadium (V), niobium (Nb), tungsten (W), or silicon (Si).

7. The method of claim 3, wherein at least one of the first sub-layer, the second sub-layer, or the third sub-layer comprises at least one or more of $AlO_x$, $AlN_x$, $AlO_xN_y$, $HfN_x$, $ZrNx$, $SiN_x$, $HfO_xN_y$, $ZrO_xN_y$, $AlO_xN_y$, $TaO_xN_y$, $HfAlO_x$, $HfSiO_x$, $HfTiO_x$, $Hf_xSi_yO_zN_{(1-x-y-z)}$, $Zr_xSi_yO_zN_{(1-x-y-z)}$, $Hf_xZr_yOzN_{(1-x-y-z)}$, or $Hf_xAl_yO_zN_{(1-x-y-z)}$.

8. The method of claim 3, wherein each of the sub-layers has a thickness between about 10 and 100 angstroms (Å).

* * * * *